US012751246B2

(12) United States Patent
Matsuyama

(10) Patent No.: US 12,751,246 B2
(45) Date of Patent: Sep. 29, 2026

(54) SUBSTRATE PROCESSING APPARATUS AND SUBSTRATE PROCESSING METHOD

(71) Applicant: Tokyo Electron Limited, Tokyo (JP)

(72) Inventor: Kenichirou Matsuyama, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 465 days.

(21) Appl. No.: 18/036,079

(22) PCT Filed: Nov. 2, 2021

(86) PCT No.: PCT/JP2021/040428
§ 371 (c)(1),
(2) Date: May 9, 2023

(87) PCT Pub. No.: WO2022/102475
PCT Pub. Date: May 19, 2022

(65) Prior Publication Data

US 2024/0021457 A1 Jan. 18, 2024

(30) Foreign Application Priority Data

Nov. 16, 2020 (JP) ................................ 2020-190402

(51) Int. Cl.
*H10P 72/30* (2026.01)
*G03F 7/00* (2006.01)
(Continued)

(52) U.S. Cl.
CPC ...... *H10P 72/3304* (2026.01); *G03F 7/70725* (2013.01); *H10P 72/0612* (2026.01);
(Continued)

(58) Field of Classification Search
CPC ......... H01L 21/67745; H01L 21/67276; H01L 21/677; H01L 21/68707; H01L 21/67769;
(Continued)

(56) References Cited

U.S. PATENT DOCUMENTS

2005/0209721 A1* 9/2005 Teferra ............. H01L 21/67775 700/100
2007/0176265 A1* 8/2007 Takano ............ H01L 21/67276 257/618
(Continued)

FOREIGN PATENT DOCUMENTS

JP 2000236008 A * 8/2000
JP 2010-171276 A 8/2010
WO WO-2006081519 A2 * 8/2006 ............ H01L 21/68

OTHER PUBLICATIONS

International Search Report issued on Jan. 11, 2022 for WO 2022/102475 A1 (4 pages).

*Primary Examiner* — Kenneth M Lo
*Assistant Examiner* — Zachary Andrew Cain
(74) *Attorney, Agent, or Firm* — Venjuris, P.C.

(57) ABSTRACT

A substrate processing apparatus includes a carrier block that disposes a carrier; a processing block including a processing module that processes a substrate; a carry-in port and a carry-out port; a substrate discharge port and a substrate reception port provided in the carrier block and mounts the carrier thereon; a first temporary carrier mount stage and a second temporary carrier mount stage that temporarily mount the carrier thereon; a carrier transfer mechanism that transfers the carrier among the carry-in port, the carry-out port, the substrate reception port, the substrate discharge port, the first temporary carrier mount stage, and the second temporary carrier mount stage; and a controller that compares a transfer time via the first temporary carrier mount stage and a transfer time via the second temporary
(Continued)

carrier mount stage, and output a control signal for controlling an operation of the carrier transfer mechanism.

7 Claims, 10 Drawing Sheets

(51) Int. Cl.
*H10P 72/00* (2026.01)
*H10P 72/76* (2026.01)

(52) U.S. Cl.
CPC .......... *H10P 72/30* (2026.01); *H10P 72/7602* (2026.01); *H10P 72/3404* (2026.01)

(58) Field of Classification Search
CPC ............... H01L 21/027; H01L 21/6773; H01L 21/67173; H01L 21/67178; H01L 21/67766; H01L 21/67775; G03F 7/70725
See application file for complete search history.

(56) References Cited

U.S. PATENT DOCUMENTS

2010/0191362 A1* 7/2010 Tsukinoki ......... H01L 21/67769 700/114
2012/0034062 A1* 2/2012 Fukutomi ......... H01L 21/67769 414/800

* cited by examiner

SUBSTRATE PROCESSING APPARATUS AND SUBSTRATE PROCESSING METHOD

CROSS REFERENCE TO RELATED APPLICATIONS

This application is a national phase of PCT application No. PCT/JP2021/040428, filed on Nov. 2, 2021, which claims priority from Japanese patent application No. 2020-190402, filed on Nov. 16, 2020, all of which are incorporated herein by reference.

TECHNICAL FIELD

The present disclosure relates to a substrate processing apparatus and a substrate processing method.

BACKGROUND

In a process of manufacturing semiconductor devices, a substrate processing apparatus performs various types of processing such as photolithography on a semiconductor wafer, which is a substrate (hereinafter, referred to as a wafer). The wafer is transferred among apparatuses, in a state of being accommodated in a carrier, which is a transfer container.

As an example of the substrate processing apparatus described above, Patent Document 1 discloses a coating and developing apparatus. The coating and developing apparatus includes a carrier mounting section where a carrier is mounted to carry wafers into/out of the apparatus, and a temporary carrier mounting section where a carrier is transferred by an overhead transfer mechanism that transfers a carrier between substrate processing apparatuses. A carrier movement mechanism provided in the coating and developing apparatus transfers the carrier between the carrier mounting section and the temporary carrier mounting section.

PRIOR ART DOCUMENT

Patent Document

Patent Document 1: Japanese Patent Laid-Open Publication No. 2010-171276

SUMMARY OF THE INVENTION

Problems to be Solved

The present disclosure provides a technology, which can prevent a delay in carrying substrates into/out of a substrate processing apparatus, thereby improving the throughput of the apparatus.

Means to Solve the Problem

A substrate processing apparatus of the present disclosure includes: a carrier block configured to dispose a carrier that accommodates a substrate; a processing block including a processing module that processes the substrate while delivering the substrate from and to the carrier block; a carrier carry-in port and a carrier carry-out port configured to mount the carrier thereon in order to carry the carrier into/out of the substrate processing apparatus; a substrate discharge port and a substrate reception port provided in the carrier block and configured to mount the carrier thereon to discharge the substrate from the carrier to the processing block and carry the substrate from the processing block into the carrier; a first temporary carrier mount stage and a second temporary carrier mount stage each configured to temporarily mount the carrier thereon; a carrier transfer mechanism configured to transfer the carrier among the carrier carry-in port, the carrier carry-out port, the substrate reception port, the substrate discharge port, the first temporary carrier mount stage, and the second temporary carrier mount stage; and a controller configured to compare, to transfer the carrier from a transfer source among the carrier carry-in port, the substrate discharge port, the substrate reception port, and the carrier carry-out port to a transfer destination via the first temporary carrier mount stage or the second temporary carrier mount stage, a transfer time via the first temporary carrier mount stage and a transfer time via the second temporary carrier mount stage, and output a control signal for controlling an operation of the carrier transfer mechanism to transfer the carrier to either one of the first temporary carrier mount stage and the second temporary carrier mount stage, which has a shorter transfer time.

Effect of the Invention

The present disclosure can prevent a delay in carrying substrates into or out of a substrate processing apparatus, thereby improving the throughput of the apparatus.

DETAILED DESCRIPTION TO EXECUTE THE INVENTION

A coating and developing apparatus 1, which is an embodiment of a substrate processing apparatus of the present disclosure, will be described with reference to the plan view of FIG. 1 and the longitudinal cross-sectional side view of FIG. 2. The coating and developing apparatus 1 includes a carrier block D1, a processing block D2, and an interface block D3, which are connected to each other in a row along the horizontal direction. The direction following the row will be referred to as the front-rear direction, and the side of the carrier block D1 will be referred to as the front side. The blocks D1 to D3 are partitioned from each other. An exposure machine D4 is connected to the rear side of the interface block D3.

The carrier block D1 is a block where wafers W are carried into/out of the coating and developing apparatus 1. The wafers W are carried into/out of the carrier block D1, in a state of being accommodated in a carrier C called, for example, a front opening unify pod (FOUP). That is, the carrier C is a transfer container for transferring wafers W, and is mounted in the carrier block D1.

Figure 3:
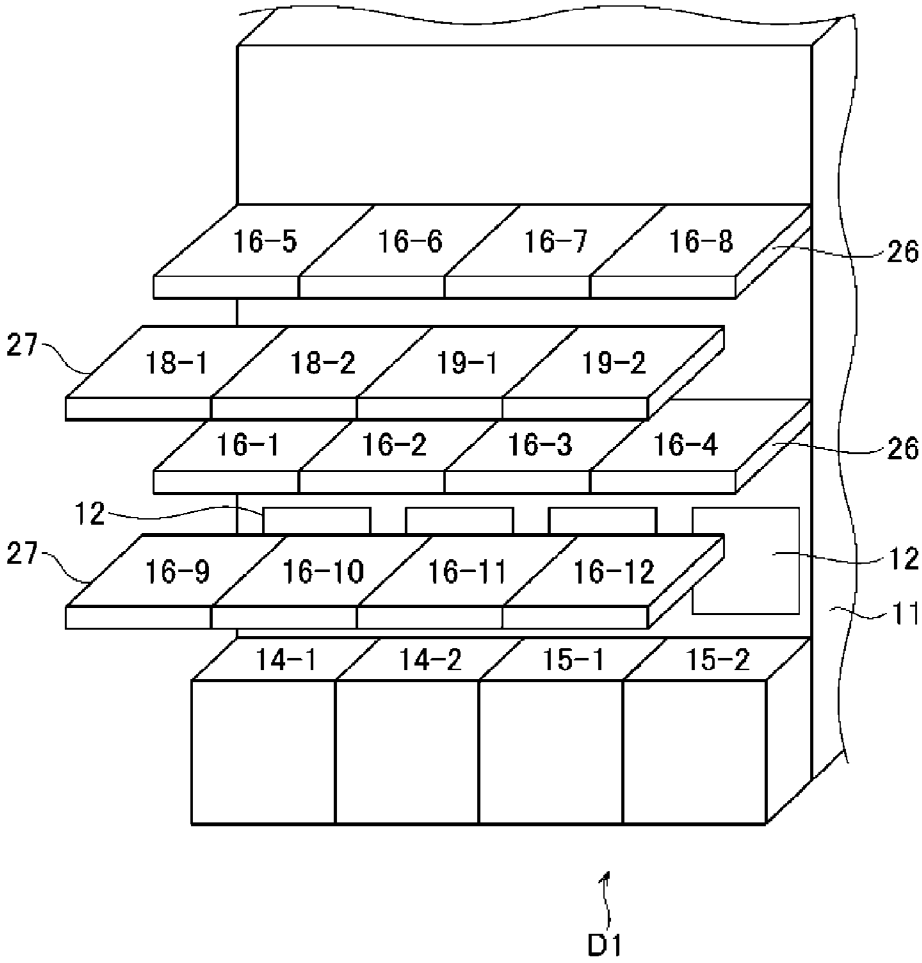
FIG. 3 is a schematic perspective view illustrating a carrier block in the coating and developing apparatus.

FIG. 3 illustrates a schematic perspective view of the carrier block D1. In FIG. 3, the reference numeral "11" indicates a housing of the carrier block D1, four transfer ports 12 for wafers W are arranged side by side in the left-right direction at the lower portion of the front face of the housing 11 while making up load ports and being freely opened and closed, and a carrier stage is provided at the front side below each transfer port 12. The carrier stages on which carriers C are to be mounted move between a forward unload position and a rearward load position. At the unload position, a carrier C is delivered with respect to the carrier stage. At the load position, wafers W are delivered between a carrier C and the carrier block D1, and the lid of the carrier C is also opened/closed by an opening/closing mechanism 13 that opens/closes the transfer ports 12.

In the front view of the housing 11 of the carrier block D1, the two left carrier stages mount thereon carriers C already accommodating wafers W, and the wafers W are sent (delivered) from the inside of each carrier C to the apparatus. Thus, these carrier stages will be referred to as sender stages 14. Of the two sender stages 14 that are substrate discharge ports, the left one and the right one may be distinguishably denoted by 14-1 and 14-2, respectively.

In the front view of the carrier block D1, the two right carrier stages mount thereon carriers C that have finished sending wafers W to the apparatus, and wafers W are carried into the carriers C from the apparatus. Thus, these carrier stages will be referred to as receiver stages 15. Of the two receiver stages 15 that are substrate reception ports, the left one and the right one may be distinguishably denoted by 15-1 and 15-2, respectively. Further, the carriers C mounted on the sender stages 14 may be referred to as sender carriers, and the carriers C mounted on the receiver stages 15 may be referred to as receiver carriers.

A transfer mechanism 20 is provided in the housing 11 of the carrier block D1. The transfer mechanism 20 transfers wafers W from the carriers C mounted on the sender stages 14 to the processing block D2, and also transfers wafers W from the processing block D2 to the carriers C mounted on the receiver stages 15.

Shelves 26 are provided in two tiers above the sender stages 14 and the receiver stages 15. Further, shelves 27 are provided in two tiers in front of the shelves 26, respectively. Each of the two shelves 26 and the lower shelf 27 is divided into four regions in the left-right direction, and the respective regions are configured as stockers 16, which may each temporarily mount a carrier C thereon. The stockers 16, which are temporary mount stages, may be numbered to be distinguishable from each other. The numbers 16-1, 16-2, 16-3, and 16-4 are assigned in this order from the left side of the lower shelf 26; the numbers 16-5, 16-6, 16-7, and 16-8 are assigned in this order from the left side of the upper shelf 26; and the numbers 16-9, 16-10, 16-11, and 16-12 are assigned in this order from the left side of the lower shelf 27.

In the upper shelf 27, two load stages 18 and two unload stages 19 are provided. An overhead hoist transfer (OHT), which is a transfer mechanism provided in a factory where the coating and developing apparatus 1 is provided, transfers carriers C to the load stages 18 and takes carriers C out of the unload stages 19. That is, the load stages 18 mount thereon carriers C accommodating wafers W that have not yet been processed in the coating and developing apparatus 1, and the unload stages 19 mount thereon carriers C accommodating wafers W that have been processed in the coating and developing apparatus 1. Thus, the load stages 18 and the unload stages 19 are configured as carrier carry-in ports and carrier carry-out ports, respectively. The two load stages 18 may be denoted by 18-1 and 18-2, respectively, the two unload stages may be denoted by 19-1 and 19-2, respectively, and the load and unload stages are arranged in an order of 18-1, 18-2, 19-1, and 19-2 from the left toward the right.

Figure 1:
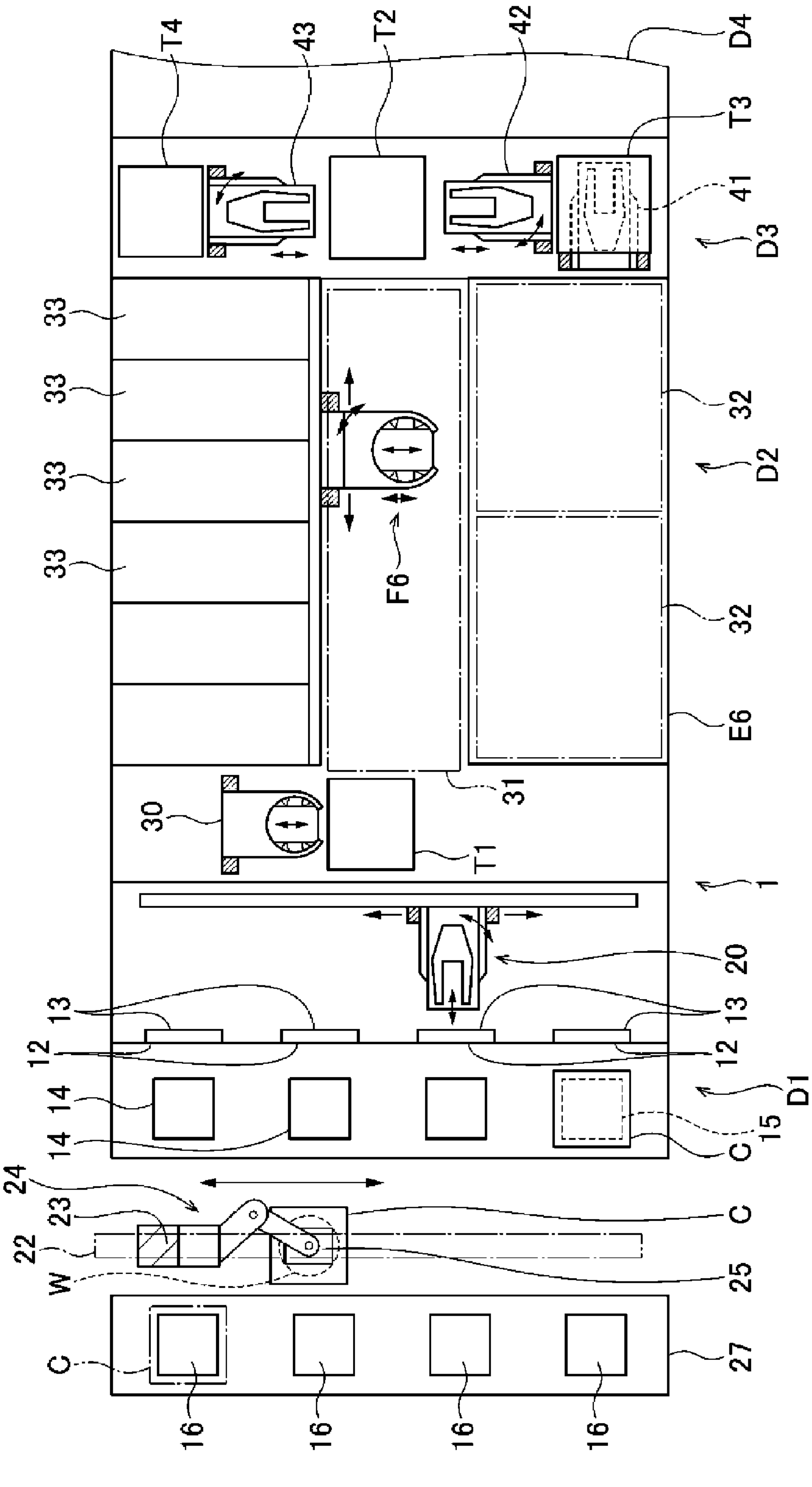
FIG. 1 is a plan view of a coating and developing apparatus according to an embodiment of a substrate processing apparatus of the present disclosure.
Figure 2:
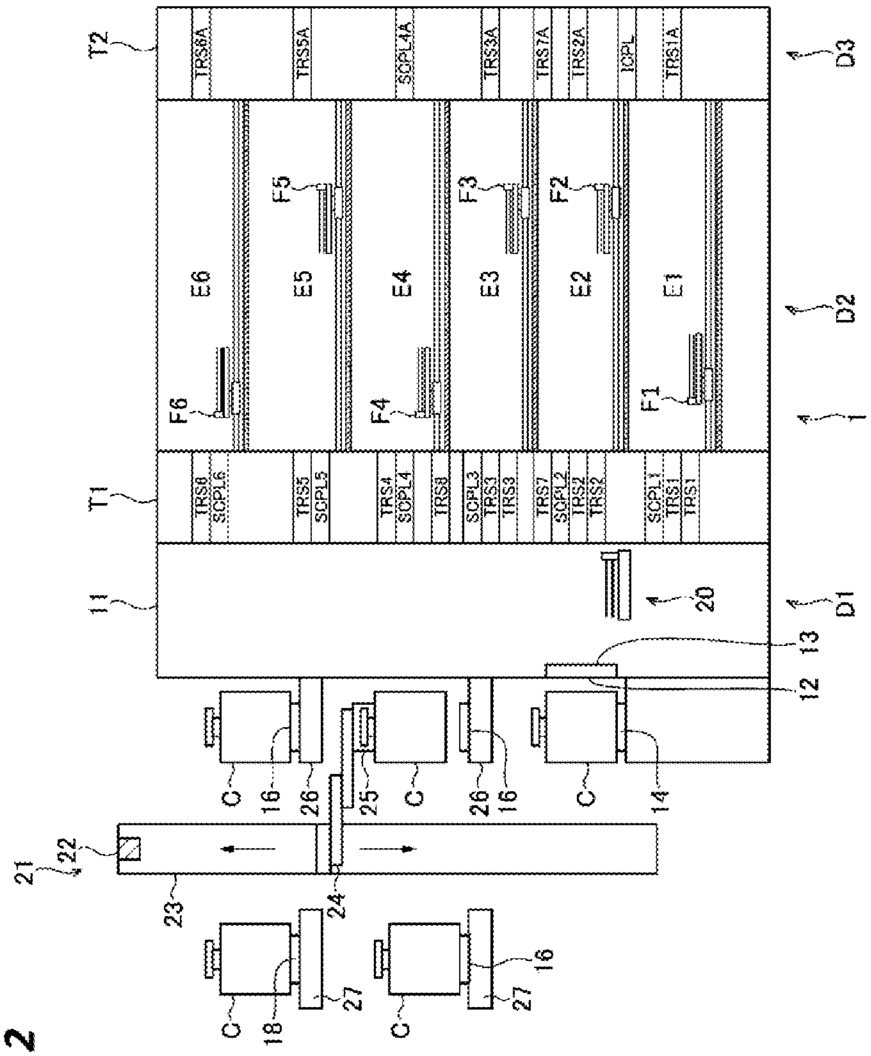
FIG. 2 is a longitudinal cross-sectional front view of the coating and developing apparatus.

A carrier transfer mechanism 21 is provided between the shelves 26 and 27 (see FIGS. 1 and 2). The carrier transfer mechanism 21 includes a lifting shaft 23 that is freely movable along a movement shaft 22 extending in the left-right direction, a multi-joint arm 24 that freely moves up and down along the lifting shaft 23, and two claws 25 provided at the front end of the multi-joint arm 24. The distance between the two claws 25 may be freely changed such that the claws 25 may grasp a holding part CO provided on the upper side of a carrier C. By the carrier transfer mechanism 21, carriers C may be transferred among the sender stages 14, the receiver stages 15, the stockers 16, the load stages 18, and the unload stages 19.

Next, the configuration of the processing block D2 will be described. The processing block D2 is configured with six unit blocks E1 to E6 that are partitioned from each other and stacked in the numerical order from the bottom. In the respective unit blocks E (E1 to E6), the transfer and the processing of wafers W are performed in parallel. The unit blocks E1 to E3 have the same configuration, and the unit blocks E4 to E6 have the same configuration. Among the unit blocks E1 to E6, the unit block E6 illustrated in FIG. 1 will be described as a representative. A transfer path 31 for wafers W is formed at the center of the unit block E6 in the left-right direction, to extend in the front-rear direction. A plurality of development modules 32 is provided on one side of the transfer path 31 in the left-right direction. A plurality of heating modules 33 is arranged in the front-rear direction on the other side of the transfer path 31 in the left-right direction, to perform a post exposure bake (PEB), which is a heating process performed after an exposure and before a development. Further, in the transfer path 31 described above, a transfer arm F6 is provided as a transfer mechanism for transferring wafers W in the unit block E6.

As for the unit blocks E1 to E3, focusing on the differences from the unit block E6, the unit blocks E1 to E3 each include resist film formation modules, instead of the development modules 32. The resist film formation modules apply a resist as a chemical liquid to wafers W, to form a resist film. Further, the unit blocks E1 to E3 each include heating modules for heating wafers W with the resist film formed thereon, instead of the PEB heating modules 33. In FIG. 2, the transfer arms of the unit blocks E1 to E5 that each correspond to the transfer arm F6 are indicated as F1 to F5, respectively.

At the left end of the transfer path 31 of each of the unit blocks E1 to E6, a tower T1 is provided to extend vertically across the unit blocks E1 through E6. In the tower T1, delivery modules TRS and temperature adjustment modules SCPL are provided at heights corresponding to the unit blocks E1 to E6, respectively, and wafers W may be delivered among the modules of the tower T1 by a transfer mechanism 30 provided near the tower T1 to be freely movable up and down.

The modules TRS and SCPL of the tower T1 are indicated as TRS1 to TRS6 and SCPL1 to SCPL6, which include the same numbers as the corresponding unit blocks E1 to E6. TRS1 to TRS6 and a TRS at each location to be described later are modules that temporarily mount wafers W thereon in order to deliver the wafers W between the transfer mechanisms, and are accessed by the transfer arms F1 to F6. In the tower T1, TRS7 and TRS8 are further provided in order to deliver wafers W between the transfer mechanism 30 and the transfer mechanism 20 of the carrier block D1. SCPL1 to SCPL6 described above are modules capable of adjusting the temperature of wafers W.

The places where wafers W are to be mounted will be referred to as modules. Further, among the modules, modules that perform a processing on wafers W will be referred to as processing modules, such as the temperature control modules SCPL, the development modules 32, and the resist film formation modules. Actually, the processing block D2 further includes modules other than the above-described modules, but the illustration thereof is omitted in order to simplify the description.

Next, the interface block D3 will be described. The interface block D3 includes towers T2 to T4 that extend vertically across the unit blocks E1 through E6. Further, in the interface block D3, transfer mechanisms 41 to 43 are provided to deliver wafers W among various modules provided in the towers T2 to T4, and only the modules of the tower T2 are illustrated while omitting the illustration of modules of the other towers, in order to simplify the description. To the same effect, descriptions will be made, assuming that wafers W are transferred only by the transfer mechanisms 41 and 42 among the transfer mechanisms 41 to 43.

The tower T2 includes TRS at the height of each of the unit blocks E1 to E6, and the modules TRS positioned at the same heights as the unit blocks will be indicated as TRS1A to TRS6A, respectively, to which the same numbers as the unit blocks and the alphabet A are assigned. Further, in the tower T2, ICPL and TRS7A are provided as modules that deliver wafers W with respect to the exposure machine D4. Similar to SCPL, ICPL adjusts the temperature of wafers W.

Figure 4:
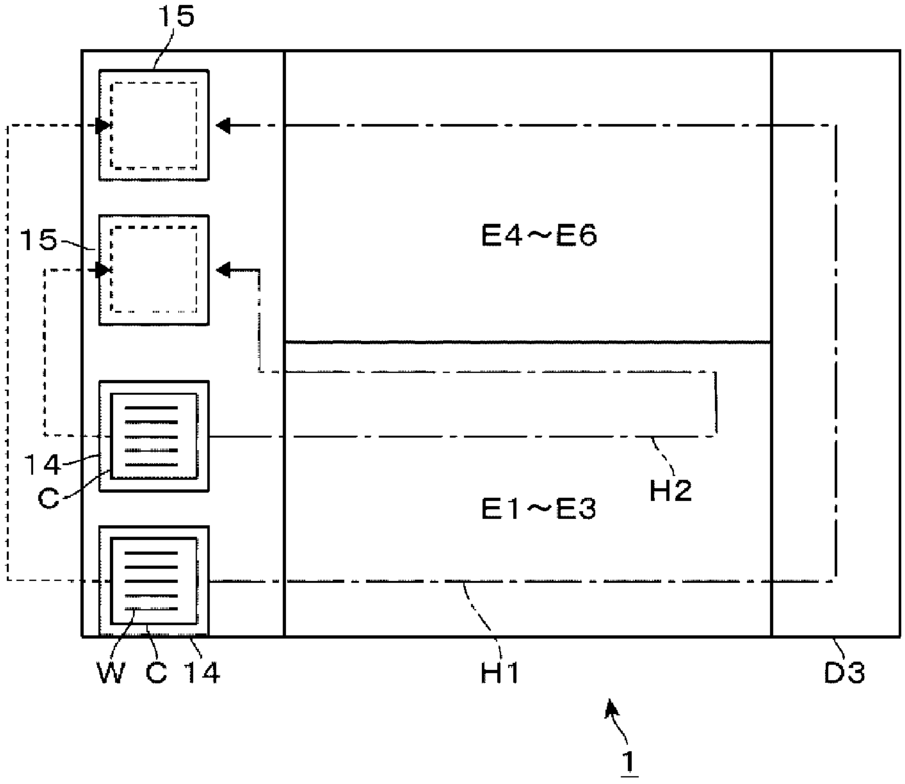
FIG. 4 is a schematic view illustrating a transfer path of a wafer.

Wafers W are transferred along transfer paths specified by PJ to be described later. Among the transfer paths, a first transfer path H1 and a second transfer path H2 will be described with reference to FIG. 4 illustrating outlines of the transfer paths. The first transfer path H1 is a transfer path where wafers W pass through one of the unit blocks E1 to E3 and one of the unit blocks E4 to E6, and a resist pattern is formed on the wafers W. Wafers W sent from the sender carriers C of the sender stages 14 by the transfer mechanism 20 are transferred to the delivery module TRS7 of the tower T1, and distributed to the delivery modules TRS1 to TRS3 of the tower T1 by the transfer mechanism 30. Then, the wafers W are received by the transfer arms F1 to F3, and transferred in an order of the temperature adjustment modules SCPL1 to SCPL3→the resist film formation modules→the heating modules. The wafers W that have been transferred in this way and thus have a resist film thereon are transferred to the delivery modules TRS1A to TRS3A, and further transferred in an order of the transfer mechanism 42→ICPL→the transfer mechanism 41→the exposure machine D4, so that the resist film is exposed.

After the exposure, the wafers W are transferred in an order of the transfer mechanism 41→TRS7A, and then, distributed to the delivery modules TRS4A to TRS6A by the transfer mechanism 42. The wafers W that have been transferred to TRS4A to TRS6A in this way are transferred by the transfer arms F4 to F6 in an order of the heating modules 33→the temperature adjustment modules SCPL4 to SCPL6→the development modules 32. As a result, a resist film is developed, and a resist pattern is formed on the wafers W. The developed wafers W are transferred to the delivery modules TRS4 to TRS6, then transferred in an order of the transfer mechanism 30→the delivery module TRS8, and carried into the receiver carriers C of the receiver stages 15 by the transfer mechanism 20.

Next, the second transfer path H2 will be described. The second transfer path H2 is a transfer path where wafers W pass through only one of the unit blocks E1 to E3 among the unit blocks E1 to E6, and of the resist film formation process and the resist film development process, only the resist film formation process is performed on the wafers W. Focusing on the differences from the first transfer path H1, wafers W are transferred from the sender carriers C to the delivery modules TRS1 to TRS3 through the delivery module TRS7. Then, the wafers W are transferred in an order of the temperature adjustment modules SCPL1 to SCPL3→the resist film formation modules→the heating modules. Then, the processed wafers W are transferred to the delivery modules TRS1 to TRS3, further transferred to the delivery module TRS8 by the transfer mechanism 30, and returned to the carriers C of the receiver stages 15. Here, a plurality of modules is provided for each of TRS1 to TRS3, and different modules are used for the carry-in from TRS7 and the carry-out to TRS8.

Meanwhile, when a carrier C is carried into the coating and developing apparatus 1, a process job (PJ) is set for wafers W in the carrier C. The PJ is information that specifies a process recipe for wafers W (including a transfer recipe that specifies a module, which is a transfer destination of wafers W and processes the wafers W), and transfer target wafers W. Since wafers W with the same PJ are subjected to the same processing, the wafers W make up the same lot.

When one PJ is set for multiple wafers W, and another PJ is set for multiple wafers W, a control unit 51 to be described later controls the operation of each transfer mechanism, such that the wafers W of one PJ are continuously carried into the apparatus, and then, the wafers W of another PJ are continuously carried into the apparatus. That is, after wafers W of a preceding PJ are organized and carried into the apparatus, wafers W of a subsequent PJ are organized and transferred to the apparatus. Then, each wafer W is transferred along a transfer path specified in its PJ, and undergoes a processing by a process recipe specified in the PJ in each processing module in the middle of the transfer path. The process recipe includes parameters such as the number of rotations of a wafer W during, for example, a liquid processing, and the temperature of a wafer W during a heating process. In the descriptions herein below, each PJ will be distinguished by adding an alphabet thereto such as PJ-A, PJ-B, PJ-C, . . . , and it is assumed that the PJ is performed in the alphabetical order. That is, a wafer W with PJ-A, a wafer W with PJ-B, a wafer W with PJ-C, . . . are carried in this order into the apparatus, and each undergoes a processing.

Figure 5:
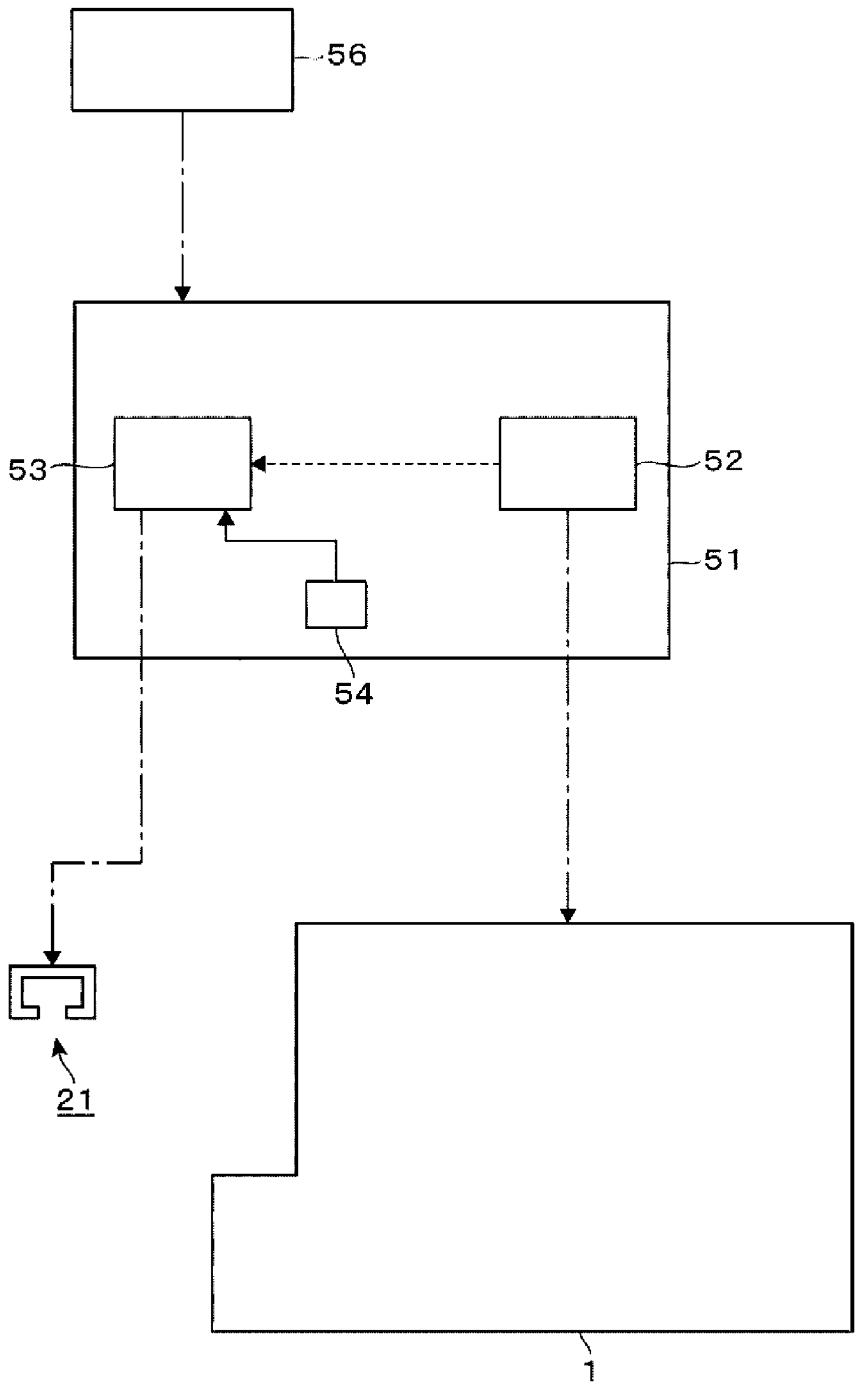
FIG. 5 is a block diagram illustrating a control unit of the coating and developing apparatus.

As illustrated in FIG. 5, the coating and developing apparatus 1 includes the control unit 51 configured with a computer. The control unit 51 includes a wafer processing program 52 and a carrier transfer program 53. The wafer processing program 52 has a set of steps for transferring wafers W as described above and processing wafers W in each module, and outputs a control signal to each module or each transfer mechanism of wafers W so as to execute the transfer and the processing. The carrier transfer program 53 has a set of steps for performing the transfer of a carrier C to be described later, and outputs a control signal to the carrier transfer mechanism 21 so as to execute the transfer. The wafer processing program 52 and the carrier transfer program 53 operate in cooperation with each other to execute the transfer and the processing of wafers W and the transfer of a carrier C to be described later. Further, the carrier transfer program 53 executes the selection of a stocker 16 on which a carrier C is to be mounted as described in detail later, and various calculations for the selection. The wafer processing program 52 and the carrier transfer program 53 are stored in a storage medium, such as a compact disk, a hard disk, or a DVD, and installed in the control unit 51.

The control unit 51 includes a memory 54 that stores a time required when each transfer mechanism of wafers W performs a transfer of one process, that is, a time necessary for the transfer of a wafer W from one module to a subsequent module. Further, the memory 54 stores parameters related to the speed of the carrier transfer mechanism 21 of a carrier C. The carrier transfer program 53 described above is configured to calculate a transfer time based on the parameters, when it is determined from/to which stage or stocker 16 a carrier C is to be transferred.

Meanwhile, the wafer processing program 52 is configured to calculate a processing time of a wafer W in each processing module based on the process recipe described above, and also calculate a stay time of a wafer W in each processing module (referred to as a module using time (MUT)) from the processing time. The MUT is obtained by adding, to the processing time, a time required from the carry of a wafer W into a processing module until the start of a processing and a time required from the end of the processing until the time when the wafer W becomes ready to be carried out from the processing module. The MUT and the transfer time of one process by the transfer mechanism of a wafer W are used to select a stocker 16 to which a carrier C is to be transferred, and details thereof will be described later.

The control unit 51 is connected to a host control unit 56. The host control unit 56 controls the operation of the OHT described above. Further, the host control unit 56 sends a carrier-out instruction to the control unit 51. The carrier-out instruction allows the transfer of a carrier C to the unload stages 19, and is issued for each carrier C. That is, among carriers C that have finished collecting sent wafers W, a carrier C for which the carrier-out instruction has been output may be transferred to the unload stages 19, but a carrier C for which the carrier-out instruction has not been output may not be transferred to the unload stages 19.

The carrier block D1 will be described in more detail. In the carrier block D1, the carrier transfer mechanism 21 described above may transfer a carrier C to which wafers W have been sent, from each sender stage 14 to another location. As a result, the sender stage 14 is prevented from being occupied by the same carrier C for a long time, and subsequent carriers C may be sequentially transferred to the sender stage 14 so as to send wafers W into the apparatus. Further, the carrier transfer mechanism 21 sequentially transfers a carrier C, which has finished sending wafers W out, to each receiver stage 15, and transfers a carrier C, which has finished accommodating wafers W, from the receiver stage 15 to another location. As a result, the receiver stage 15 is prevented from being occupied by the same carrier C for a long time, and wafers W may be sequentially collected into each carrier C from the inside of the apparatus.

Figure 6:
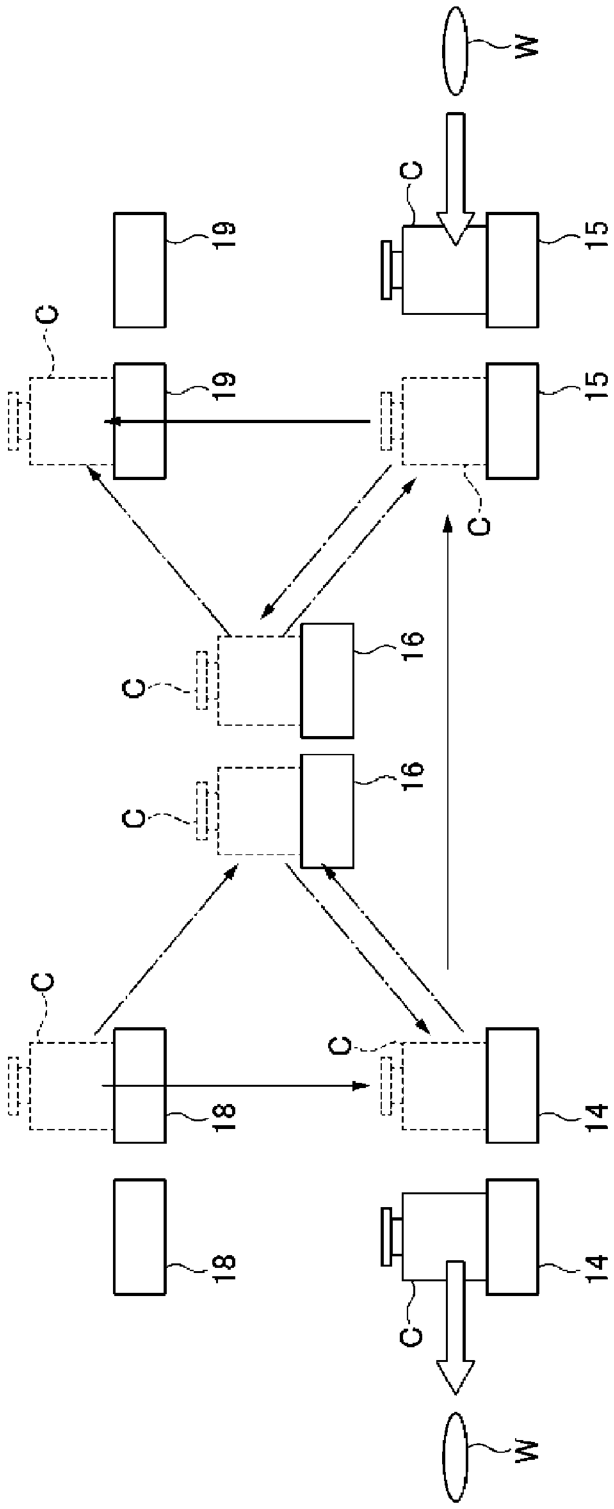
FIG. 6 is a view illustrating a transfer path of a carrier.

FIG. 6 is a schematic view illustrating an outline of a transfer path of a carrier C. A carrier C transferred from the OHT to the load stage 18 is transferred in an order of the load stage 18→the sender stage 14→the receiver stage 15→the unload stage 19, as indicated by a solid arrow. Meanwhile, in a case of transferring a carrier C from a transfer source stage, when a transfer destination stage is not available (all of transfer destination stages are being occupied by other carriers C), the carrier C is temporarily transferred to a stocker 16 and stands by thereon, as indicated by an alternate long and short dash line. After standing by, the carrier C is transferred from the stocker 16 to the transfer destination.

Further, when the carrier-out instruction described above is not output for a carrier C, into which wafers W have been completely carried, on the receiver stage 15, the carrier C is transferred to a stocker 16, regardless of whether the unload stage 19 is available. In this way, a carrier C is transferred directly from a transfer source stage to a transfer destination stage without being transferred to a stocker 16, except for a case where the transfer destination stage is not available and a case where the carrier-out instruction is not issued for the transfer to the unload stage 19.

Transfer in Comparative Example

In order to verify the effect of a method of transferring a carrier C in an Example of the present disclosure to be described later, the transfer of a carrier C in a Comparative Example will be described. In the Comparative Example, when the transfer to a stocker 16 is necessary as described in FIG. 6, a carrier C is transferred to a stocker with a lower number among the available stockers 16-1 to 16-12.

Figure 7:
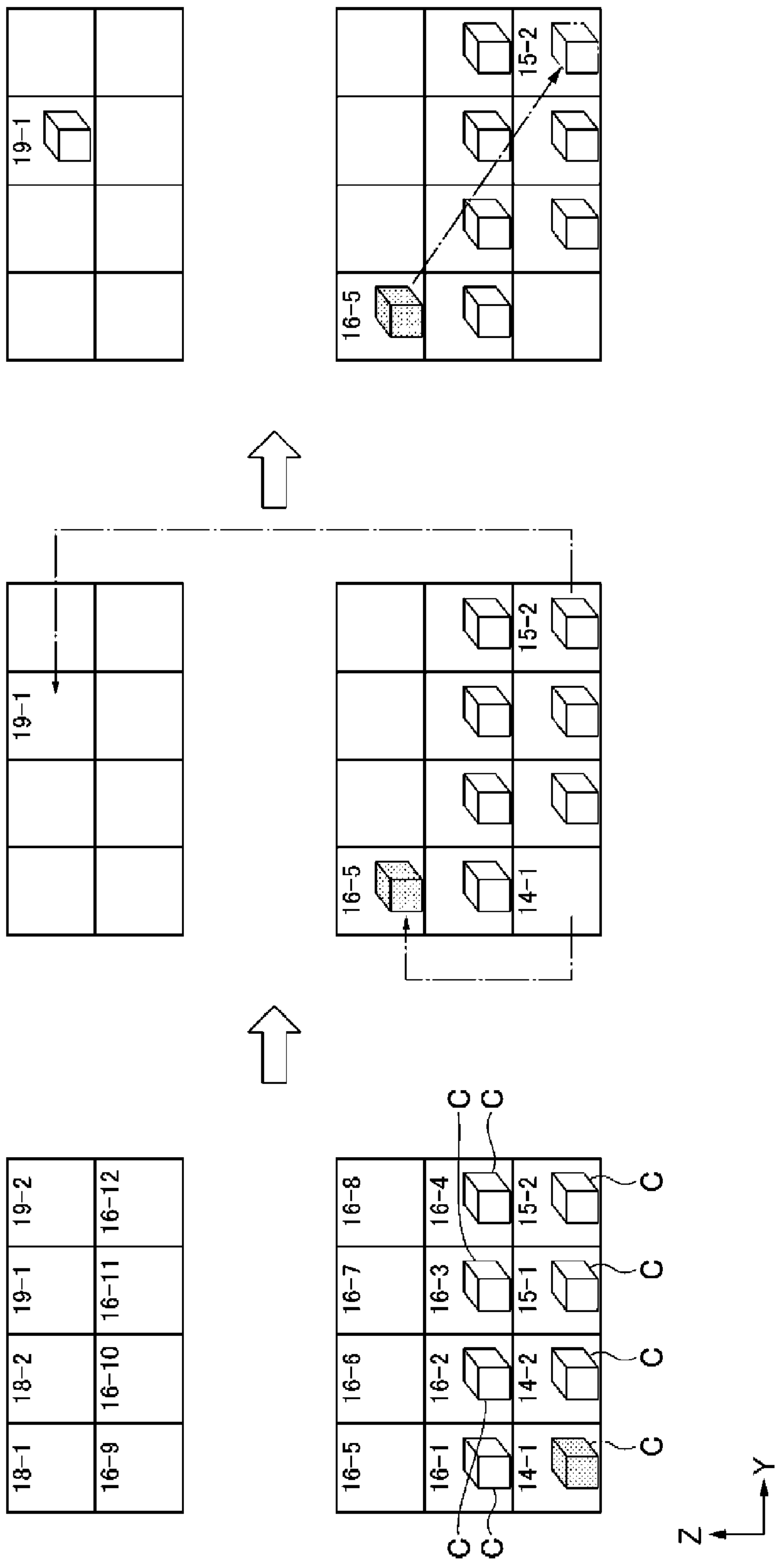
FIG. 7 is a schematic view illustrating a transfer of a carrier in a Comparative Example.

This will be more specifically described with reference to FIG. 7 schematically illustrating each stage and the stockers 16. FIG. 7 and the subsequent drawings illustrate the rearward stages and stockers 16 of the carrier block D1 in one upper table, and the forward stages and stockers 16 thereof in one lower stable. Each stage and each stocker 16 are schematically illustrated as partitioned table cells. Hereafter, each square in the vertical and horizontal rows will be described as a stage, and the vertical and horizontal directions are defined as a Z-axis direction and a Y-axis direction, respectively. Further, in FIG. 7 and the subsequent drawings, the stages and the stockers 16 positioned at the front side and the stages and the stockers 16 positioned at the rear side in FIG. 3 are illustrated separately in the up-down direction. Accordingly, the arrangement of the stages and the stockers 16 in the tables corresponds to the arrangement described in FIG. 3. Further, among the multiple carriers C illustrated in each drawing, a transfer target carrier C is dotted.

In the Comparison Example illustrated in FIG. 7, the carrier C of the sender stage 14-1 is a transfer target carrier as the carrier has finished sending wafers W to the apparatus, and the receiver stages 15 are both occupied by carriers C. Accordingly, the carrier C of the sender stage 14-1 will be transferred to a stocker 16, while the stockers 16-1 to 16-4 already mount carriers C thereon. Thus, according to the rule described above, the carrier C of the sender stage 14-1 is transferred to the stocker 16-5 having the lowest number among the available stockers (see the left side and the center of FIG. 7). Therefore, the carrier C moves two stages in the Z-axis direction.

Then, of the receiver stages 15, it is assumed that as the carrier C of the receiver stage 15-2 is transferred to the unload stage 19-1, the receiver stage 15-2 becomes vacant. Therefore, the carrier C of the stocker 16-5 is transferred to the receiver stage 15-2. Since the carrier C moves three stages in the Y-axis direction and two stages in the Z-axis direction according to the transfer, the transfer distance is relatively long (see the right side of FIG. 7). Accordingly, the time necessary for transferring the carrier C from the sender stage 14-1 to the receiver stage 15-2 is relatively long.

During the transfer of one carrier C, the carrier transfer mechanism 21 may not transfer another carrier C. Thus, even when another carrier C in the carrier block D1 becomes ready to be transferred during the transfer of the preceding carrier C from the stocker 16-5 to the receiver stage 15-2, the transfer of another carrier C may not be performed, and as a result, the timing for starting the transfer of another carrier C may be delayed. That is, in the Comparative Example, the selection of a stocker 16 according to numbers may cause the delay in transferring carriers C, and therefore, may delay the carry-in/out of wafers W with respect to the coating and developing apparatus 1. As a result, a sufficiently high throughput may not be obtained in the coating and developing apparatus 1.

Outline of Example

Figure 8:
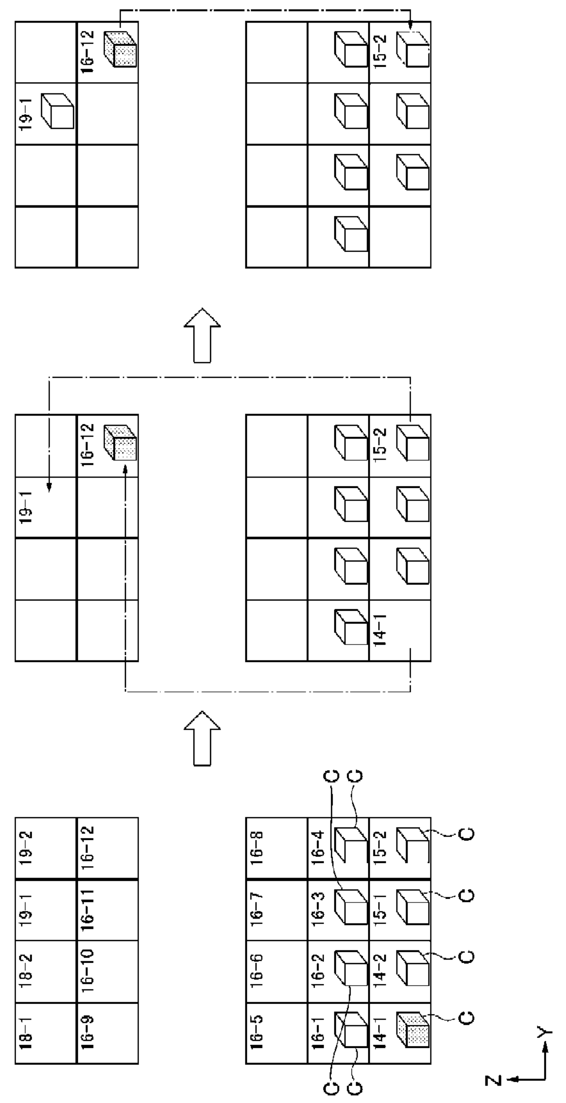
FIG. 8 is a schematic view illustrating a transfer of a carrier in an Example.

Next, the outline of the Example of the present disclosure will be described with reference to FIG. 8. FIG. 8 illustrates an example of a transfer of the carrier C of the sender stage 14-1, under the same condition as the Comparative Example, that is, a condition that the receiver stages 15 and the stockers 16-1 to 16-4 are not available. In this Example, among the available stockers 16, a stocker 16 is selected as an evacuation destination, which has the smallest sum of the time of transfer from the sender stage 14-1, which is a transfer source, and the time of transfer to the receiver stage 15-2, which is a transfer destination. Details of the selecting method will be described later, and in this case, the stocker 16-12 is selected, and the carrier C is transferred from the sender stage 14-1 to the stocker 16-12 (the left side and the center of FIG. 8). Thus, the carrier C is transferred three stages in the Y-axis direction and one stage in the Z-axis direction. Thereafter, when the receiver stage 15-2 becomes available, the carrier C of the stocker 16-12 is transferred to the receiver stage 15-2 (the right side of FIG. 8). Thus, the carrier C moves only one stage in the Z-axis direction.

As described above, in the Comparative Example, the carrier C moves a total of three stages in the Y-axis direction and a total of four stages in the Z-axis direction, until being transferred to the receiver stage 15-2 from the sender stage 14-1 via the stocker 16 of the evacuation destination. Meanwhile, in the Example, as the carrier C moves a total of three stages in the Y-axis direction and a total of two stages in the Z-axis direction, the distance required to transfer the carrier C is shorter than the Comparison Example. Accordingly, the time required for the transfer is also shorter.

While the outline of the Example has been described taking the transfer from the sender stage 14 to the receiver stage 15 for example, the same applies to the transfer of a carrier C between another transfer source and another transfer destination. That is, when a carrier C is transferred from a transfer source stage to a transfer destination stage via a stocker 16, a stocker 16 is selected as an evacuation destination, which has the smallest sum of the time of transfer from the transfer source stage and the time of transfer to the transfer destination stage, and the carrier C is transferred to the selected stocker 16.

Hereinafter, descriptions will be made on a method of selecting a stocker 16 for the transfer in each of the following sections: the load stage 18→the sender stage 14; the sender stage 14→the receiver stage 15; and the receiver stage 15→the unload stage 19, using Examples 1, 2, and 3. Further, in the outline of the Example described above, the receiver stage 15-2 is predetermined as the transfer destination of the carrier C. Meanwhile, when selecting a stocker 16, a transfer destination is selected among a plurality of transfer destination candidates. The selection of a transfer destination will also be described in each of the Examples.

Example 1

Figure 9:
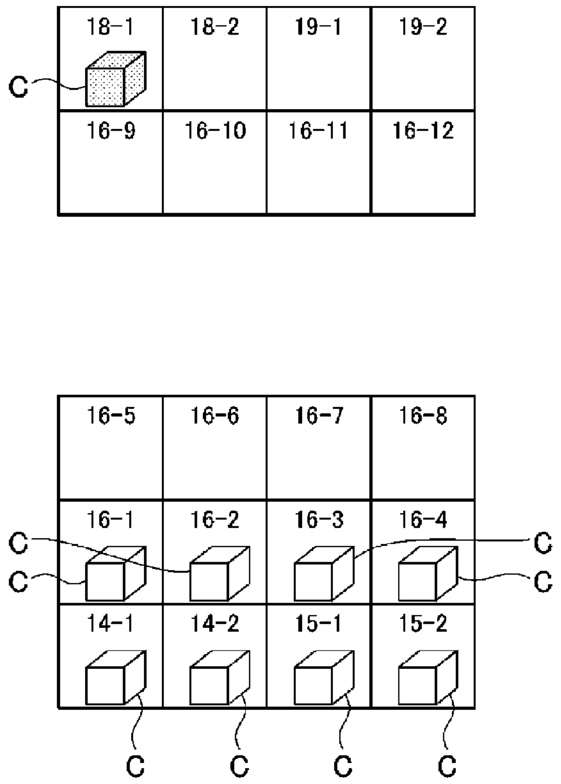
FIG. 9 is a schematic view illustrating a transfer of a carrier in an Example.

Example 1 will be described with reference to FIG. 9. FIG. 9 illustrates a state where a carrier C can be transferred from the load stage 18-1, but the sender stages 14-1 and 14-2 are not available. Accordingly, the transfer is performed along the load stage 18-1→a stocker 16→a sender stage 14.

In a first step of a procedure for selecting a stocker 16, the availability of the stockers 16 is determined, and vacant stockers 16 become candidates for a retreat destination (temporary transfer destination) of the carrier C. In the example illustrated in FIG. 9, since the stockers 16-1 to 16-4 currently mount carriers C thereon, the stockers 16-5 to 16-12 become the retreat destination candidates. Then, in a second step, calculations are performed to obtain a transfer time of the transfer from the load stage 18-1 of the transfer source to each of the stockers 16-5 to 16-12 identified as the retreat destination candidates in the first step (referred to as a first transfer time). That is, the first transfer time is calculated for each of the stockers 16-5 to 16-12, such as, for example, 10 seconds for 16-5, 15 seconds for 16-6, . . . , and 20 seconds for 16-12.

Subsequently, in a third step, it is determined which of the sender stages 14-1 and 14-2 of the transfer destination candidates will be a transfer destination. The determination is performed by selecting either one of the sender stages 14-1 and 14-2, which becomes vacant earlier than the other by transferring its carrier C to another location, as the transfer destination.

The determination of a transfer destination will be described in more detail. As described above, wafers W are sent from the respective carriers C of the sender stages 14 to the apparatus according to the order of PJ. Thus, at the timing of transferring the carrier C from the load stage 18-1, wafers W remaining in the carrier C of the sender stage 14-1 and wafers W remaining in the carrier C of the sender stage 14-2 are compared. Then, a sender stage is determined to be a transfer destination, which mounts thereon a carrier C with an earlier order of PJ for sending the last wafer W. To describe a specific example, it is assumed that the wafers W remaining in the carrier C of the sender stage 14-1 have PJ-A and PJ-B, and the wafers W remaining in the carrier C of the sender stage 14-2 have PJ-C. Accordingly, PJ of the last wafer W to be sent out from the carrier C of 14-1 is PJ-B, and PJ of the last wafer W to be sent out from the carrier C of 14-2 is PJ-C. Since the wafer W of PJ-B is sent out earlier than the wafer W of PJ-C, the carrier C of the sender stage 14-1 may be transferred to another location earlier, and as a result, 14-1 is determined to be a transfer destination. That is, which of the sender stages 14 will be a transfer destination is determined according to the processing order of the lots of wafers W in the sender stages 14-1 and 14-2.

Meanwhile, it may be assumed that the wafers W remaining in the carriers C of the sender stages 14-1 and 14-2 have the same PJ, and are sent out in an alternate manner from each carrier C. In this case, a carrier C is determined to be a transfer destination, which accommodates the smaller number of wafers W that have not been sent out and have remained therein. Specifically, it is assumed that only PJ-A remains in each of the carriers C of the sender stages 14-1 and 14-2, and the number of wafers W in the carrier C of 14-1 is 13, and the number of wafers W in the carrier C of 14-2 is 14. In this case, as the carrier C of 14-1 finishes sending the wafers W out and becomes ready to be transferred to another location, 14-1 is determined to be a transfer destination. In this way, when it is not possible to determine a sender stage 14 to be a transfer destination only with the processing order of the lots, the transfer destination is determined based on the number of wafers W remaining in the carrier C of each sender stage 14.

Assuming that the sender stage 14-1 is determined to be a transfer destination in the third step, the subsequent steps will be described hereinafter. In a fourth step, calculations are performed to obtain a transfer time of the transfer from each of the stockers 16-5 to 16-12 identified in the first step to the sender stage 14-1 that is the transfer destination determined in the third step (referred to as a second transfer time). That is, the second transfer time is calculated for each of the stockers 16-5 to 16-12, such as, for example, 10 seconds for 16-5, 15 seconds for 16-6, . . . , and 20 seconds for 16-12.

In a fifth step, calculations are performed to obtain the total time of the first and second transfer times for each of the stockers 16-5 to 16-12 identified in the first step, and it is determined to transfer the carrier C to a stocker 16 with the smallest total time. That is, the total time is calculated as follows: 10 seconds+10 seconds=20 seconds for the stocker 16-5; 15 seconds+15 seconds=30 seconds for the stocker 16-6; . . . ; and 20 seconds+20 seconds=40 seconds for the stocker 16-12, and the stocker 16 with the smallest total time is selected as a stocker 16 of a retreat destination. That is, the control unit 51 described above compares the total times, and based on the result of the comparison, a stocker 16 is selected.

Then, the carrier C is transferred from the load stage 18-1 to the stocker 16 selected as described above to stand by thereon, and when the sender stage 14-1 determined to be the transfer destination becomes available, the carrier C is transferred from the stocker 16 to the sender stage 14-1. Among the stockers 16-5 to 16-12 of the retreat destination candidates for which the total times are calculated, one stocker and another stocker correspond to a first temporary carrier mount stage and a second temporary carrier mount stage, respectively. Thus, the comparison of the total times above is a comparison between the transfer time when the transfer is performed via the first temporary carrier mount stage and the transfer time when the transfer is performed via the second temporary carrier mount stage.

Example 2

Figure 10:
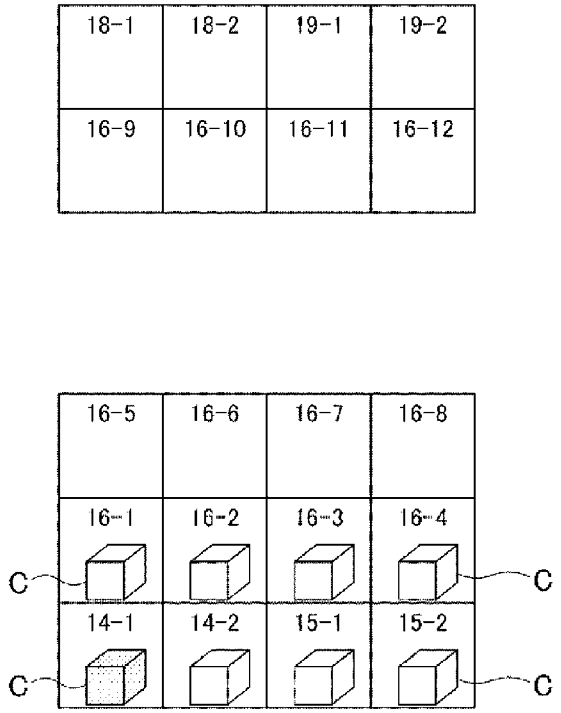
FIG. 10 is a schematic view illustrating a transfer of a carrier in an Example.

Hereinafter, Example 2 will be described with reference to FIG. 10, focusing on the differences from Example 1. FIG. 10 illustrates a state where a carrier C can be transferred from the sender stage 14-1, but the receiver stages 15-1 and 15-2 are not available. Thus, the transfer is performed along the sender stage 14-1→a stocker 16→a receiver stage 15.

In a first step of a procedure for selecting a stocker 16, the availability of the stockers 16 is determined as in Example 1, and vacant stockers 16 become candidates for the retreat destination of the carrier C. In Example 2 as well, descriptions will be made, assuming that the stockers 16-5 to 16-12 are the retreat destination candidates. Then, in a second step, calculations are performed to obtain a first transfer time of the transfer from the sender stage 14-1 of the transfer source to each of the stockers 16-5 to 16-12 identified in the first step.

Subsequently, in a third step, it is determined which of the receiver stages 15-1 and 15-2 of the transfer destination candidates will be a transfer destination. The determination is performed by selecting either one of the receiver stages 15-1 and 15-2, which becomes vacant earlier than the other by transferring its carrier C to another location, as the retreat destination. More specifically, a receiver stage 15 is determined to be a transfer destination, which mounts thereon a carrier C with an earlier timing at which the last wafer W among the wafers W scheduled to be carried into 15-1 and 15-2 arrives at the carrier C.

Hereinafter, a specific example will be described. Assuming that a wafer W of PJ-A is the last scheduled to be carried into the carrier C of the receiver stage 15-1, the wafer W will be hereinafter referred to as the last carry-in wafer W of PJ-A. Further, assuming that a wafer W of PJ-B is the last scheduled to be carried into the carrier C of the receiver stage 15-2, the wafer W will be hereinafter referred to as the last carry-in wafer W of PJ-B. Descriptions will be made, assuming that the wafers W of PJ-A and PJ-B are both transferred along the transfer path H1 described in FIG. 4, the last carry-in wafer W of PJ-A is located in the heating module 33 of the unit block E6, and the last carry-in wafer W of PJ-B is located in the heating module of the unit block E3.

For the last carry-in wafer W of PJ-A above, a predicted arrival timing at the carrier C is calculated based on the aforementioned transfer time of one process by the transfer mechanism, the MUT of the heating module 33 where the wafer W is located, and the MUT of each processing module disposed downstream of the heating module 33. Specifically, the calculation is performed as follows: MUT of the heating module 33+transfer time of one process (transfer time between the heating module 33 and SCPL6)+MUT of SCPL6+transfer time of one process (transfer time between SCPL6 and the development module 32), . . . , +transfer time of one process (transfer time between TRS8 and the carrier C). Then, from the calculation result, the arrival timing at the carrier C may be acquired for the last carry-in wafer W of PJ-A.

For the last carry-in wafer W of PJ-B as well, the same calculation is performed to acquire the predicted arrival timing at the carrier C. Specifically, the predicted arrival timing may be acquired by adding up the MUT of the processing module of the unit block E3 where the wafer W is located, the MUT of each of the subsequent processing modules on the downstream side of the transfer path, and the transfer time of one process×the number of processes of the transfer mechanism necessary until the wafer W arrives at the carrier C. In performing this calculation, the exposure machine D4 may be treated as a processing module, and for example, the interval at which the wafer W is carried out from the exposure machine D4 may be used as the MUT of the exposure machine D4.

Descriptions have been made, assuming that the wafers W of PJ-A and PJ-B are both transferred along the transfer path H1, but when the wafers W are transferred along the transfer path H2, the arrival timing at the carrier C may be acquired by performing calculations according to the transfer path H2. For example, it is assumed that PJ-B is transferred along the transfer path H2, and the last carry-in wafer W of PJ-B is located in the heating module of the unit block E3 as described above. In this case, the following calculation is performed: MUT of the heating module+transfer time of one process (transfer time between the heating module and TRS3)+transfer time of one process (transfer time between TRS3 and TRS8)+transfer time of one process (transfer time between TRS8 and the carrier C). From the calculation result, the arrival timing at the carrier C may be acquired for the last carry-in wafer W of PJ-B.

As described above, in a third step, of the respective carriers C of the receiver stages 15, a receiver stage 15 is determined to be a transfer destination, which mounts thereon a carrier C with the earliest carry-in timing of the last wafer W. The subsequent steps will be described, assuming that the arrival timing of the last carry-in wafer W of PJ-A at the carrier C is earlier, and the receiver stage 15-1, which mounts thereon the carrier C storing PJ-A is determined to be a transfer destination. In a fourth step, calculations are performed to obtain a second transfer time of the transfer from each of the stockers 16-5 to 16-12 identified in the first step to the receiver stage 15-1 that is the transfer destination determined in the third step. In a fifth step, as in Example 1, calculations are performed to obtain the total time of the first and second transfer times for each of the stockers 16-5 to 16-12, and a stocker 16 with the smallest total time is selected as a retreat destination stocker 16. That is, the control unit 51 described above compares the total times, and based on the result of the comparison, a stocker 16 is selected. Then, the carrier C is transferred from the sender stage 14-1 to the stocker 16 selected as described above, and when the receiver stage 15-1 determined to be a transfer destination becomes vacant, the carrier C is transferred from the stocker 16 to the receiver stage 15-1.

Example 3

Figure 11:
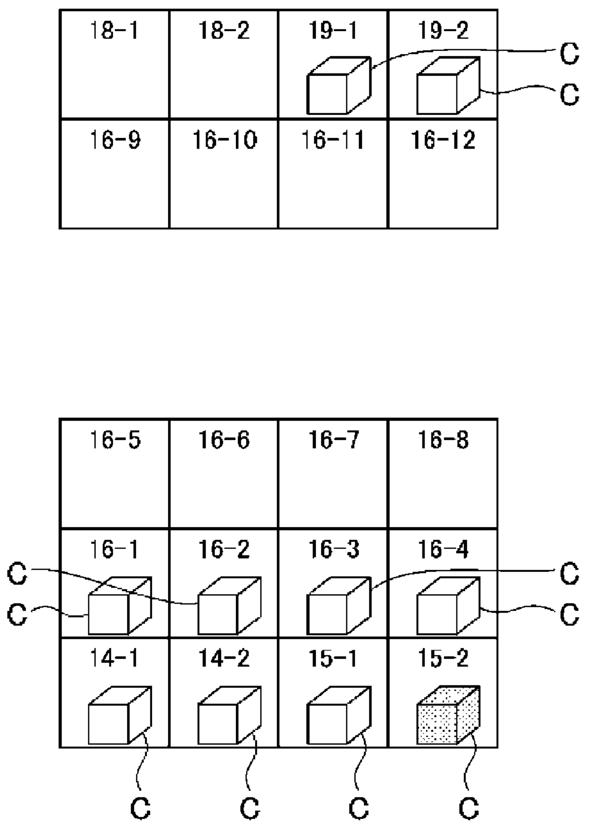
FIG. 11 is a schematic view illustrating a transfer of a carrier in an Example.

Hereinafter, Example 3 will be described with reference to FIG. 11, focusing on the differences from Examples 1 and 2. FIG. 11 illustrates a state where a carrier C can be transferred from the receiver stage 15-2, but the unload stages 19-1 and 19-2 are not available. Accordingly, the transfer is performed along the receiver stage 15-2→a stocker 16→an unload stage 19. Further, it is assumed that the carrier-out instruction has already been issued for the carrier C.

In a first step of a procedure for selecting a stocker 16, as in Examples 1 and 2, the availability of the stockers 16 is determined, and vacant stockers 16 become candidates for the retreat destination of the carrier C. As in Examples 1 and 2, it is also assumed in Example 3 that the stockers 16-5 to 16-12 are candidates for the retreat destination of the carrier C. Then, in a second step, calculations are performed to obtain a first transfer time of the transfer from the receiver stage 15-2 of the transfer source to each of the stockers 16-5 to 16-12 identified in the first step.

Then, in a third step, a second transfer time is obtained for the transfer between the unloading stages 19-1 and 19-2 and the stockers 16-5 to 16-12 identified in the first step. That is, a transfer time between each of the stockers 16-5 to 16-12 and the unload stage 19-1, and a transfer time between each of the stockers 16-5 to 16-12 and the unload stage 19-2 are each obtained as the second transfer time. Then, in a fourth step, the total time of the first and second transfer times is calculated for each of the stockers 16-5 to 16-12, and the total times are compared to determine that the carrier C is transferred to a stocker 16 with the smallest total time. Then, when either one of the unload stages 19-1 and 19-2 becomes available, the carrier C is transferred to the available unload stage 19.

The selection of a stocker 16 and the transfer to the unload stage 19 are performed in this way. Thus, in Example 3, the carrier C may be transferred to the unload stage 19, of the transfer destinations 19-1 and 19-2, different from the unload stage 19 from which the second transfer time used to calculate the smallest total time is acquired. That is, in Example 3, the transfer destination is determined from the unload stages 19-1 or 19-2, which is expected to have the shortest transfer time. This is because the OHT transfers carriers C with respect to the unload stages 19-1 and 19-2, and thus, the control unit 51 may not obtain, in advance, information about the timing when each of 19-1 and 19-2 becomes available.

Thus, in the third step described above, either the unload stage 19-1 or 19-2 may be determined to be a temporary transfer destination according to a predetermined regularity, and the transfer time from each of the stockers 16-5 to 16-12 to the temporary transfer destination may be calculated as the second transfer time. Specifically, for example, 19-1 and 19-2 may be determined alternately to be the temporary transfer destination.

As described above, in the coating and developing apparatus 1, when a carrier C is transferred between stages via a stocker 16, the selection of a stocker 16 is performed while reducing the total time of the transfer time from the transfer source stage to the stocker 16 and the transfer time from the stocker 16 to the transfer destination stage. Thus, the occurrence of delay is prevented when carrying wafers W of the carriers C into/out of the coating and developing apparatus 1, so that the coating and developing apparatus 1 may achieve a high throughput. Further, the load (stress) of the carrier transfer mechanism 21 is reduced, which may suppress the wear of parts and reduce the frequency of maintenance.

Further, in transferring a carrier C between stages, the carrier C is not transferred to a stocker 16 when the transfer destination stage is available. Thus, the transfer of the carrier C between the stages is performed more quickly, so that the coating and developing apparatus 1 may achieve a more reliably high throughput. Further, when determining a sender stage 14 or a receiver stage 15 to be a transfer destination, one of the multiple receiver stages 14 or the multiple receiver stages 15 is identified, from which the carrier C can be more quickly transferred to another location (a subsequent stage or stocker 16). Then, a stocker 16 is selected based on the identified stage. Thus, a more appropriate stocker 16 is selected so that the transfer time of the carrier C between the stages may be reduced to a great extent. Further, only one sender stage 14, receiver stage 15, and unload stage 19 may be provided as a transfer destination, and the coating and developing apparatus 1 may be configured not to require the selection of a transfer destination. Further, only one load stage 18 may be provided.

As for the layout of the load stages 18, the unload stages 19, the sender stages 14, the receiver stages 15, and the stockers 16 in the carrier block D1, the layout described above is merely an example, and the layout of the stages is not limited thereto as long as the stages are accessible by the carrier transfer mechanism 21. Further, the number of stages and stockers is not limited to the example described herein. While the example of the configuration described herein provides each receiver stage and each sender stage as separate stages, the receiver stage and the sender stage are not limited to being separate. That is, a single carrier stage that can be used in different ways may be provided to function as a sender stage when a carrier C accommodating wafers W is mounted, and function as a receiver stage when a carrier C that has sent out wafers W is mounted.

In the foregoing example of the apparatus configuration related to the transfer mechanism of wafers W in the carrier block D1, the wafer transfer mechanism that transfers wafers W to the processing block D2 and the wafer transfer mechanism that transfers wafers W to the carriers C are the same. However, the transfer mechanisms may be provided as separate units. Further, the present disclosure is not limited to returning wafers W to the same carrier C that has been sent from the sender stage 14.

The above-described first transfer path H1 and second transfer path H2 for wafers W in the processing block D2 are examples, and wafers W may be transferred along a transfer path passing through only one of the unit blocks E4 to E6 among the unit blocks E1 to E6, in order to undergo, for example, a development processing. Further, the processing block D2 may be configured to include only one unit block. The processing performed in the processing block D2 is not limited to the resist film formation and the development. The processing may include, for example, the formation of an anti-reflective film or an insulating film through a liquid processing, the cleaning of wafers W with a cleaning liquid supplied, and the application of an adhesive for bonding wafers W to each other. Further, the processing may include capturing an image of wafers W to inspect the surface condition thereof. Therefore, the substrate processing apparatus is not limited to the coating and developing apparatus 1.

The embodiments disclosed herein are examples, and should not be construed as limiting the present disclosure in all aspects. Omission, substitution, modification, and combination may be made on the foregoing embodiments in various forms without departing from the scope and gist of the appended claims.

LIST OF REFERENCE NUMERALS

C . . . carrier
D1 . . . carrier block
D2 . . . processing block
W . . . wafer
1 . . . coating and developing apparatus
14 . . . sender stage
15 . . . receiver stage
16 . . . stocker
18 . . . load port
19 . . . unload port
21 . . . carrier transfer mechanism

What is claimed is:

1. A substrate processing apparatus comprising:

a carrier block configured to dispose a carrier that accommodates a substrate;

a processing block including a processing module that processes the substrate while delivering the substrate from and to the carrier block;

a carrier carry-in port and a carrier carry-out port configured to mount the carrier thereon to carry the carrier into/out of the substrate processing apparatus;

a plurality of substrate discharge ports and a substrate reception port provided in the carrier block and configured to mount the carrier thereon to discharge the substrate from the carrier to the processing block and carry the substrate from the processing block into the carrier;

a first temporary carrier mount stage and a second temporary carrier mount stage each configured to temporarily mount the carrier thereon;

a carrier transfer mechanism including an arm configured to transfer the carrier among the carrier carry-in port, the carrier carry-out port, the substrate reception port, the plurality of substrate discharge ports, the first temporary carrier mount stage, and the second temporary carrier mount stage; and a controller configured to compare, in order to transfer the carrier from a transfer source to a subsequent transfer destination among the carrier carry-in port, the plurality of substrate discharge ports, the substrate reception port, and the carrier carry-out port via the first temporary carrier mount stage or the second temporary carrier mount stage, a transfer time via the first temporary carrier mount stage and a transfer time via the second temporary carrier mount stage, and output a control signal for controlling an operation of the carrier transfer mechanism to transfer the carrier to either one of the first temporary carrier mount stage and the second temporary carrier mount stage, which has a shorter transfer time, wherein, when a plurality of transfer destination candidates is provided, the controller determines the transfer destination by selecting the candidate that becomes vacant first, and in a state where the transfer source and the transfer destination are the carrier carry-in port and one of the plurality of substrate discharge ports, respectively, and the carrier is mounted on each of the plurality of substrate discharge ports, the controller determines which of the plurality of substrate discharge ports is to be the transfer destination, according to a processing order for a lot of the substrate accommodated in the carrier of each of the plurality of substrate discharge ports, and compares the transfer times.

2. The substrate processing apparatus according to claim 1, wherein the transfer time via the first temporary carrier mount stage is a total time of a transfer time of a transfer from the transfer source to the first temporary carrier mount stage and a transfer time of a transfer from the first temporary carrier mount stage to the transfer destination, and the transfer time via the second temporary carrier mount stage is a total time of a transfer time of a transfer from the transfer source to the second temporary carrier mount stage and a transfer time of a transfer from the second temporary carrier mount stage to the transfer destination.

3. The substrate processing apparatus according to claim 1, wherein, when the transfer destination is available, the controller outputs a control signal to directly transfer the carrier from the transfer source to the transfer destination without being transferred to the first and second temporary carrier mount stages.

4. The substrate processing apparatus according to claim 1, wherein the controller determines one of the plurality of substrate discharge ports to be the transfer destination, based on the processing order for the lot of the substrate and a number of substrates accommodated in the carrier of each of the plurality of substrate discharge ports.

5. The substrate processing apparatus according to claim 1, wherein a plurality of substrate reception ports is provided, and in a state where the transfer source is one of the plurality of substrate discharge ports, the transfer destination is one of the plurality of substrate reception ports, and the carrier is mounted on each of the plurality of substrate reception ports, with respect to the carrier mounted on each of the plurality of substrate reception ports, the controller determines a substrate reception port, which mounts thereon the carrier with an earliest carry-in timing of a last substrate to be carried into the carrier, to be the transfer destination, and compares the transfer times.

6. A substrate processing method comprising:

providing a substrate processing apparatus including a carrier block in which a carrier is disposed, the carrier being a transfer container that accommodates a substrate, and a processing block including a processing module that processes the substrate while delivering the substrate from and to the carrier block, mounting the carrier on each of a carrier carry-in port and a carrier carry-out port to carry the carrier into/out of the substrate processing apparatus;

mounting the carrier on each of a plurality of substrate discharge ports and a substrate reception port provided in the carrier block to discharge the substrate from the carrier to the processing block and carry the substrate from the processing block into the carrier;

temporarily mounting the carrier on a first temporary carrier mount stage and a second temporary carrier mount stage;

transferring the carrier by a carrier transfer mechanism between the carrier carry-in port, the carrier carry-out port, the substrate reception port, the plurality of substrate discharge ports, and one of the first temporary carrier mount stage and the second temporary carrier mount stage;

transferring the carrier by the carrier transfer mechanism among the carrier carry-in port, the carrier carry-out port, the substrate reception port, the plurality of substrate discharge ports, the first temporary carrier mount stage, and the second temporary carrier mount stage; and in transferring the carrier from a transfer source among the carrier carry-in port, the substrate discharge port, the substrate reception port, and the carrier carry-out port to a transfer destination via the first temporary carrier mount stage or the second temporary carrier mount stage, comparing a transfer time via the first temporary carrier mount stage and a transfer time via the second temporary carrier mount stage, and transferring the carrier to either one of the first temporary carrier mount stage and the second temporary carrier mount stage, which has a shorter transfer time, wherein, when a plurality of transfer destination candidates is provided, a controller determines the transfer destination by selecting the candidate that becomes vacant first, and in a state where the transfer source and the transfer destination are the carrier carry-in port and one of the plurality of substrate discharge ports, respectively, and the carrier is mounted on each of the plurality of substrate discharge ports, the controller determines which of the plurality of substrate discharge ports is to be the transfer destination, according to a processing order for a lot of the substrate accommodated in the carrier of each of the plurality of substrate discharge ports, and compares the transfer times.

7. A substrate processing apparatus comprising:

a carrier block configured to dispose a carrier that accommodates a substrate;

a processing block including a processing module that processes the substrate while delivering the substrate from and to the carrier block;

a carrier carry-in port and a carrier carry-out port configured to mount the carrier thereon to carry the carrier into/out of the substrate processing apparatus;

a substrate discharge port and a plurality of substrate reception ports provided in the carrier block and configured to mount the carrier thereon to discharge the substrate from the carrier to the processing block and carry the substrate from the processing block into the carrier;

a first temporary carrier mount stage and a second temporary carrier mount stage each configured to temporarily mount the carrier thereon;

a carrier transfer mechanism including an arm configured to transfer the carrier among the carrier carry-in port, the carrier carry-out port, the plurality of substrate reception ports, the substrate discharge port, the first temporary carrier mount stage, and the second temporary carrier mount stage; and a controller configured to compare, in order to transfer the carrier from a transfer source to a subsequent transfer destination among the carrier carry-in port, the substrate discharge port, the plurality of substrate reception ports, and the carrier carry-out port via the first temporary carrier mount stage or the second temporary carrier mount stage, a transfer time via the first temporary carrier mount stage and a transfer time via the second temporary carrier mount stage, and output a control signal for controlling an operation of the carrier transfer mechanism to transfer the carrier to either one of the first temporary carrier mount stage and the second temporary carrier mount stage, which has a shorter transfer time, wherein, when a plurality of transfer destination candidates is provided, the controller determines the transfer destination by selecting the candidate that becomes vacant first, and in a state where the transfer source is the substrate discharge port, the transfer destination is one of the plurality of substrate reception ports, and the carrier is mounted on each of the plurality of substrate reception ports, with respect to the carrier mounted on each of the plurality of substrate reception ports, the controller determines a substrate reception port, which mounts thereon the carrier with an earliest carry-in timing of a last substrate to be carried into the carrier, to be the transfer destination, and compares the transfer times.

* * * * *